United States Patent [19]
Claverie et al.

[11] Patent Number: 5,999,045
[45] Date of Patent: Dec. 7, 1999

[54] AMPLIFICATION CIRCUIT WHICH INCLUDES AN INPUT-CURRENT COMPENSATION DEVICE

[75] Inventors: Claude Claverie, Rennes; Patrick Hardy, Baulon; Stéphane Hergault, La Mézière, all of France

[73] Assignee: Thomson Broadcast Systems, Cergy Pontoise, France

[21] Appl. No.: 08/968,015

[22] Filed: Nov. 12, 1997

[30] Foreign Application Priority Data

Nov. 14, 1996 [FR] France ................................ 96 13888

[51] Int. Cl.⁶ .......................... H03F 21/00; H03K 3/02
[52] U.S. Cl. ............................................ 330/11; 348/707
[58] Field of Search ............................. 330/11; 348/707, 348/691, 693, 698

[56] References Cited

U.S. PATENT DOCUMENTS

| | | | |
|---|---|---|---|
| 3,207,998 | 9/1965 | Corney et al. | 330/11 |
| 3,551,596 | 12/1970 | Borenstein | 348/698 |
| 3,609,230 | 9/1971 | Paine | 330/11 |
| 3,811,053 | 5/1974 | Habib | 327/321 |
| 4,242,640 | 12/1980 | Bean | 348/707 |
| 4,296,437 | 10/1981 | Geurts | 348/698 |
| 4,544,951 | 10/1985 | Yoshisato | 348/691 |
| 4,644,198 | 2/1987 | Ahmed | 307/549 |

OTHER PUBLICATIONS 4644198 (Ahmed) "Signal Clamp" Feb. 17, 1987 JP 61109376 May 27, 1986.

*Primary Examiner*—Robert Pascal
*Assistant Examiner*—Khanh van Nguyen
*Attorney, Agent, or Firm*—Joseph S. Tripoli; Peter M. Emanuel; Paul P. Kiel

[57] ABSTRACT

An amplification circuit comprising a device for compensating for its input current. The amplification circuit includes an amplifier and a capacitor located on the input side of the amplifier. The input-current compensation device consists of a current generator, generating a current Ig, a switch and a device for measuring the average current charging or discharging the capacitor during the time that the switch is open. The current Ig is such that: Average current=Ia−Ig, where Ia is the input current of the amplifier. The value of the average current is close to zero. The value of the current Ig which the current generator must output, so as to make the average current close to zero, is calculated using the device for measuring the average current. The invention particularly applies to a circuit for restoring the DC component of a video signal.

34 Claims, 4 Drawing Sheets

AMPLIFICATION CIRCUIT WHICH INCLUDES AN INPUT-CURRENT COMPENSATION DEVICE

BACKGROUND OF THE INVENTION

The invention relates to an amplification circuit and more particularly to an amplification circuit which includes a device for compensating for its input current.

The invention will be more particularly described within the framework of the restoration of the DC component of a video signal.

However, as will emerge later, the invention relates to other applications such as, for example the stabilization of a voltage.

As is known to those skilled in the art, the DC component of the video signal delivered by an image sensor is not transmitted by the processing circuits located on the output side of the image sensor. A circuit for restoring the DC component of a video signal is therefore necessary.

The circuit in FIG. 1 represents a diagram showing the principle of a circuit for restoring the DC component of a video signal according to the prior art.

The circuit in FIG. 1 includes a capacitor C, commonly called a clamping capacitor, a switch K and an amplifier A1.

The switch K has an on-state resistance $R_{ON}$, the value of which is typically less than or equal to 100 Ω, and an off-state resistance of virtually infinite value.

The video signal VE is applied to a first plate of the capacitor C, the second plate of which is connected to the input of the amplifier A1. A first terminal of the switch K is connected to the common point connecting the second plate of the capacitor C and the input of the amplifier A1, and a second terminal of the switch K is connected to the earth of the circuit. As is known to those skilled in the art, the output voltage VS1 of the amplifier A1 is preferably equal to zero volts.

When the switch K is closed, the second plate of the capacitor is earthed, to the earth of the circuit, with the time constant $\tau = C \times R_{ON}$. As is known to those skilled in the art, the switch K is closed by the action of a control pulse generated from a sync signal.

The switch is closed for a time T lying within the line blanking interval, after the trailing edge of the sync signal. The time τ is adjusted so as to be very much shorter than the time T, which is about 3 to 4 μs. It follows that the input voltage of the amplifier A1 is clamped to earth at each line, whatever the value of the potential present on the input of the amplifier A1 at the moment when the switch K closes.

Between two line sync pulses, the capacitor C behaves as a battery and delivers its input current Ia to the amplifier A1. The variation in voltage $\Delta V_c$ which then appears across the terminals of the capacitor C is such that:

$\Delta V_c = \Delta Q/C$, with $\Delta Q = Ia \times T_L$ where $T_L$ represents the time separating two line sync pulses.

It follows therefore that:

$$\Delta V_c = T_L \times Ia/C.$$

In order to minimize the value of $\Delta V_c$, the amplifier A1 is chosen so as to have a high input impedance. It follows that the current Ia is small and that the voltage variation $\Delta V_c$ can then be neglected.

Thus, according to the known prior art, the input stage of the amplifier A1 is produced either using one or two junction field-effect transistors (JFET) or using one or two field-effect transistors of the MOSFET type, the JFET and MOSFET transistors having virtually infinite input impedances.

The use of JFET or MOSFET transistors has, however, many drawbacks.

This is because JFET transistors, apart from the fact that they are expensive, have a high consumption, typically about 30 mA, and, for their supply, they require a format of voltages of relatively high value (typically between +12 volts and −12 volts).

With regard to MOSFET transistors, the noise voltage density which they generate is very high, about 20 to 25 nV per √Hz, thereby preventing any use of these transistors for professional applications.

The invention does not have such drawbacks.

BRIEF SUMMARY OF THE INVENTION

This is because the present invention relates to an amplification circuit which includes an amplifier, having an input and an output, and a capacitor, having a first plate and a second plate, the second plate of the capacitor being connected to the input of the amplifier and the first plate of the capacitor being connected to the input voltage of the amplification circuit. The amplification circuit includes means for making the average current ie flowing through the capacitor more or less equal to zero, whatever the value of the input current Ia of the amplifier.

The means for making the average current ie flowing through the capacitor to be approximately equal to zero consist of at least one current generator Ig and of a device for measuring the average current ie so that ie=Ia−Ig.

One advantage of the invention is that it avoids the use of JFET or MOSFET transistors.

Other characteristics and advantages of the invention will appear on reading a preferred embodiment given with reference to the figures appended hereto, among which:

In all the figures, identical references denote the same components.

DETAILED DESCRIPTION

Figure 1:
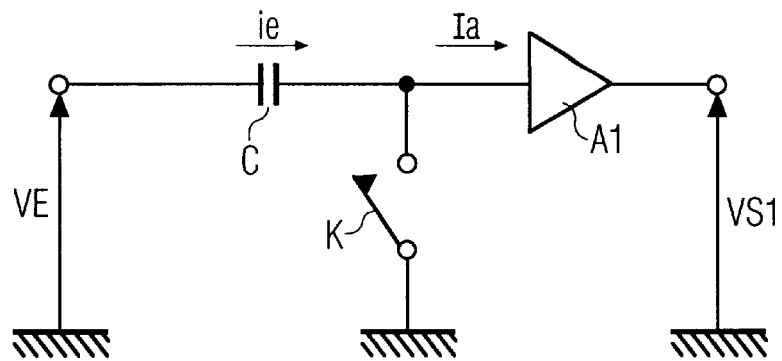
FIG. 1 represents a simplified diagram of a circuit for restoring the DC component of a video signal according to the prior art.
Figure 2:
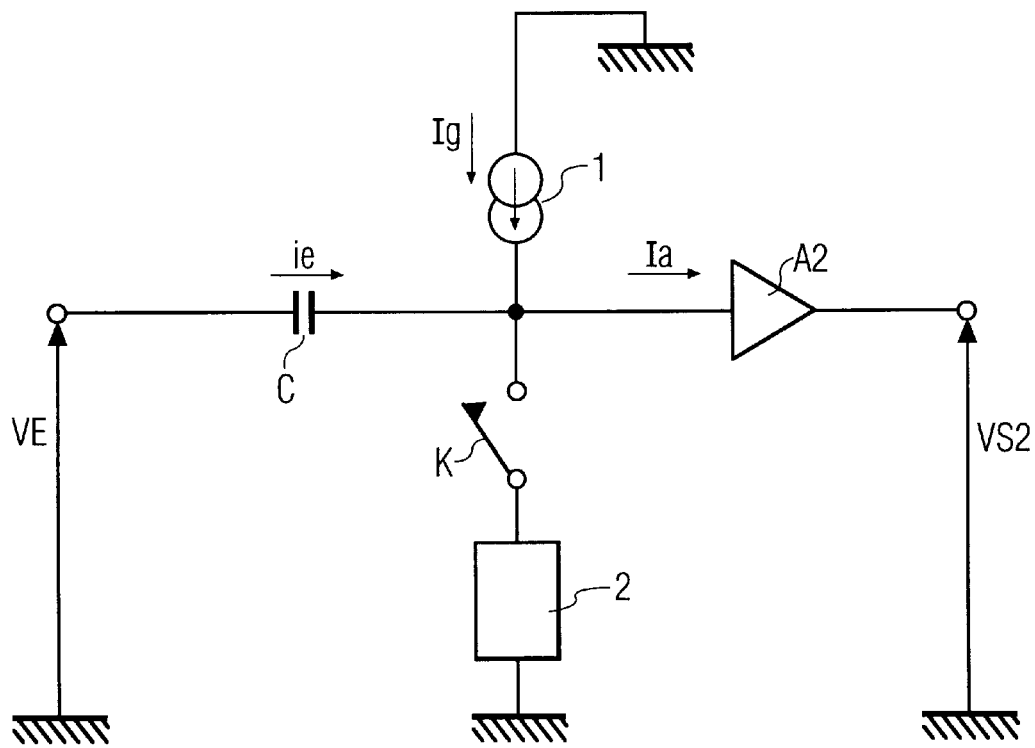
FIG. 2 represents a simplified diagram of an amplification circuit according to the invention, applied to a circuit for restoring the DC component of a video signal.

FIG. 2 shows the simplified diagram of an amplification circuit according to the invention, applied to a circuit for restoring the DC component of a video signal.

The amplification circuit according to the invention includes a clamping capacitor C, a switch K, a current generator 1, an amplifier A2 having an input current Ia and a device 2 for measuring the average value of the current ie flowing through the capacitor C. According to the preferred embodiment of the invention, the output voltage VS2 of the amplifier A2 is equal to zero volts.

The video signal VE is applied to a first plate of the capacitor C, the second plate of which is connected to the input of the amplifier A2, to a first terminal of the switch K and to a first terminal of the current generator 1. The second terminal of the switch K is connected to a first terminal of the device 2, the second terminal of which is connected to the earth of the circuit. The second terminal of the current generator is connected to the earth of the circuit.

The current Ig delivered by the current generator 1 is such that ie=Ia−Ig, where ie is the current charging or discharging the capacitor C during the time that the switch K is open.

According to the preferred embodiment of the invention, the value of the current ie is chosen so as to be close to zero. The value of the current Ig must therefore be a value very close to that of the current Ia.

According to the invention, when the switch K is open, the capacitor C is charged by the very small current ie. It follows that the current which flows through the closed switch K is also a small current. Advantageously, the variations in the input voltage of the amplifier A2 are therefore negligible.

The value of the current Ig which the current generator 1 must output is calculated from the measurement of the average value of the current ie. The calculation of the current ie is shown in detail in FIG. 3.

Figure 3:
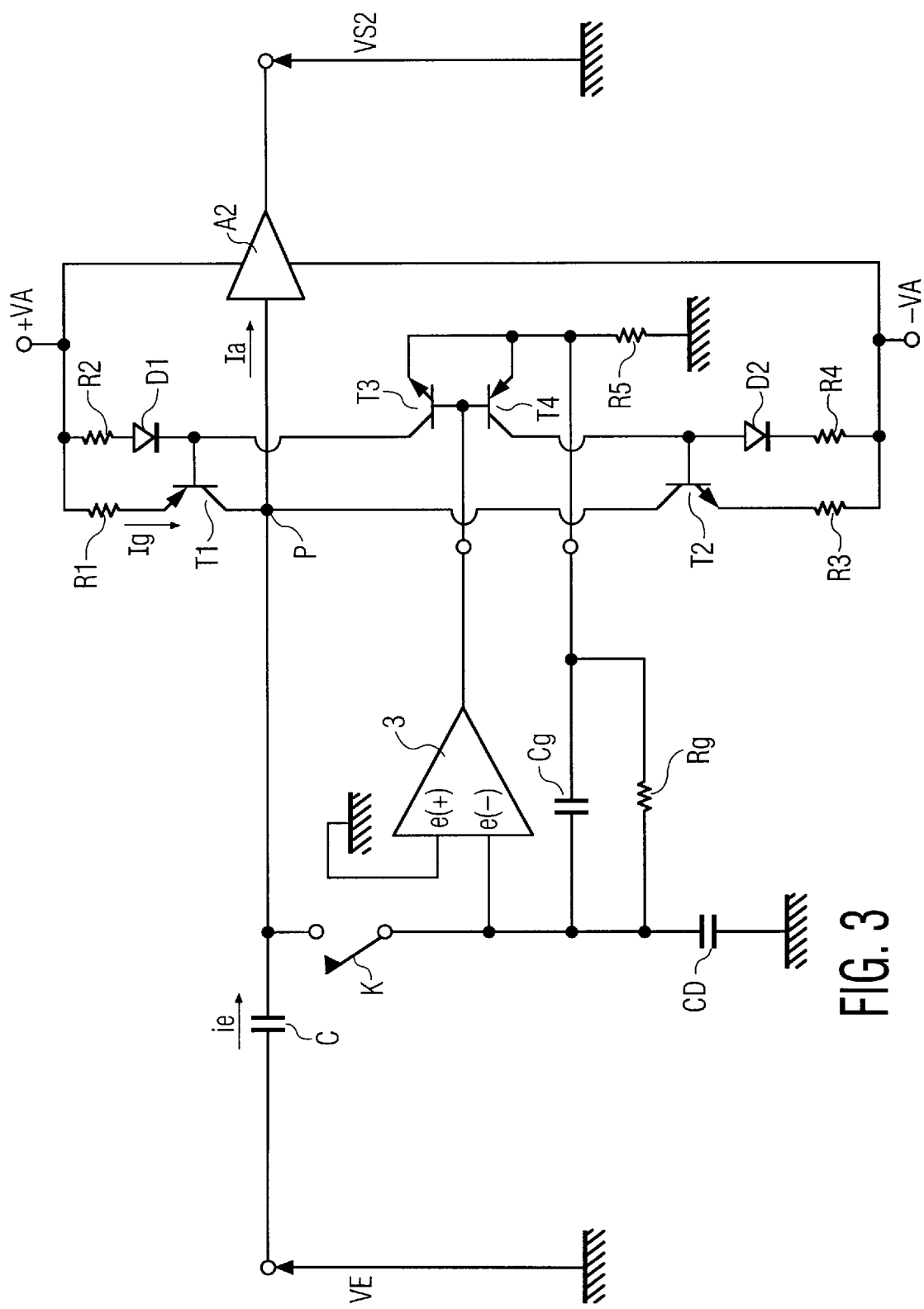
FIG. 3 represents a detailed description of the simplified diagram shown in FIG. 2.

FIG. 3 represents a detailed description, according to the preferred embodiment of the invention, of the simplified diagram shown in FIG. 2.

The device for measuring the average value of the current ie consists of the differential amplifier 3, the positive and negative inputs of which are respectively denoted by e(+) and e(−), the resistor Rg, the capacitor Cg, the transistors T3 and T4 and the resistor R5.

The transistors T3 and T4 are transistors respectively of the npn and pnp type which have their bases connected together and to the output of the differential amplifier 3. The emitter of the transistor T3 is connected to the emitter of the transistor T4 and to a first terminal of the resistor R5, the second terminal of which is connected to the earth of the circuit. The first terminal of the resistor RS is also connected, on the one hand, to the first terminal of a resistor Rg, the second terminal of which is connected to the input e(−) of the differential amplifier 3 and, on the other hand, to the first terminal of a capacitor Cg, the second terminal of which is connected to the input e(−).

Preferably, the differential amplifier 3 has a zero offset voltage. It follows that the average potential present on the input e(−) is zero.

The differential amplifier 3 has its input e(−) connected to the second terminal of the switch K and its input e(+) connected to the earth of the circuit.

FIG. 3 corresponds to the special case in which the current Ia is a current input into the amplifier A2.

In general, the current Ia to be compensated for may be either a current input into the amplifier A2 or a current output by the amplifier A2.

In order to be able to compensate for input or output currents Ia, the current generator consists of two current sources of the current-mirror type.

The first current source consists of the transistor T1, the resistors R1 and R2 and the diode D1.

The second current source consists of the transistor T2, the resistors R3 and R4 and the diode D2.

The collectors of the transistors T1 and T2 are connected together and are connected to the second plate of the capacitor C and to the input of the amplifier A2.

The emitter of the transistor T1 is connected via the resistor R1 to the positive voltage +VA of the power supply for the amplifier A2.

Likewise, the emitter of the transistor T2 is connected via the resistor R3 to the negative voltage −VA of the power supply for the amplifier A2.

The collector of the transistor T3 is connected to the base of the transistor T1, which base is connected to the cathode of the diode D1 whose anode is connected to the first terminal of the resistor R2, the second terminal of which is connected to the voltage +VA.

The collector of the transistor T4 is connected to the base of the transistor T2, which base is connected to the anode of the diode D2 whose cathode is connected to a first terminal of the resistor R4, the second terminal of which is connected to the voltage −VA.

The combination consisting of the differential amplifier 3, the transistors T3 and T4, the resistor Rg, the capacitor Cg and the resistor R5 is used to calculate the value of the average current flowing through the switch K, when the latter is closed, and to compare this value with the value of the collector current of the transistors T3 or T4, this value being close to that of the current Ig and the current gain of the current-mirror stages being assumed to be unity.

Thus:

$$(Ia-Ig)Rg=(Ig-ie)R5$$

now Ia−Ig=ie, so that Ig=Ia−ie
It follows that:

$$ie=Ia/((Rg/R5)+2)$$

The resistor Rg is preferably chosen with a very high value so as to form with the differential amplifier 3 an almost perfect integrator.

By giving the ratio Rg/R a high value, for example, about 100, it follows that the current ie charging or discharging the capacitor C during the time $T_L$ separating two sync line pulses has a much smaller value (typically 100 times smaller in the example chosen) than the value of the current Ia. Advantageously, the amplification circuit according to the invention has an input current ie whose average value is very small compared to the input current Ia of the amplifier A2. The parasitic voltage $\Delta V=ie \times T_L/C$ which appears on the input of the amplifier A2 is consequently very small. By way of example, for a 40 nF capacitor C, a 20 µA current Ia and an Rg/R5 ratio of about 100, the value of the parasitic voltage $\Delta V$ is about 0.3 mV.

Preferably, the amplifier A2 is a current-feedback amplifier produced, for example, in bipolar technology.

Advantageously, the closed-loop bandwidth, for example having a value equal to 150 MHz, is then independent of the value of the gain of the amplifier, the current consumption is low, about from 5 to 15 mA and the supply voltages +VA and −VA can have low values, respectively +5 V and −5 V.

The capacitor CD which connects the negative input e(−) of the differential amplifier 3 to earth has a value chosen so as to moderate the increase in the apparent impedance of the input e(−) when the frequency increases. Thus, in order for the input e(−) of the amplifier A3 to be equivalent to a virtual earth in dynamic mode, the capacitor CD must have, by way of example, a value of greater than or equal to 10 times the value of the capacitor C.

According to the preferred embodiment of the invention described above, the output voltage VS2 is equal to zero volts. However, the invention relates to other embodiments in which the voltage VS2 is different from zero. The input e(+) of the differential amplifier 3 is then no longer connected to the earth of the circuit but to a voltage source having as value the value to which the voltage VS2 must be stabilized.

Figure 4:
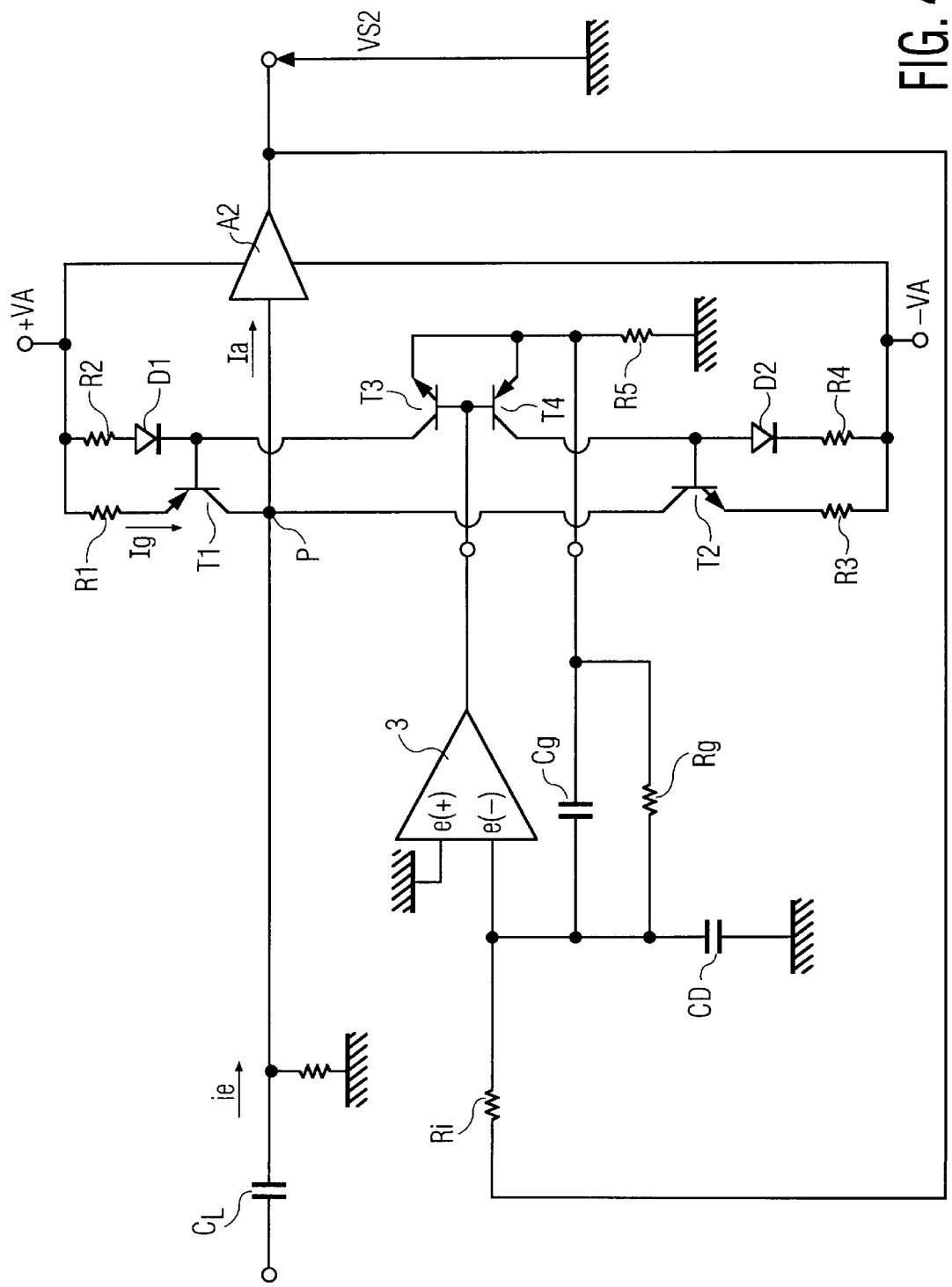
FIG. 4 represents a detailed description of an amplification circuit according to the invention, applied to a voltage stabilization circuit.

FIG. 4 represents a detailed description, according to the preferred embodiment of the invention, of an amplification circuit applied to a voltage stabilization circuit.

The voltage VS2 from a current-feedback amplifier, such as the amplifier A2 mentioned previously, is stabilized to zero volts using a compensation circuit which acts simultaneously on the input current Ia and on the offset voltage of the amplifier.

The elements making up the circuit in FIG. 4 are partly elements identical to those in FIG. 3 and partly new elements which do not appear in FIG. 3.

The elements identical to those in FIG. 3 are the amplifiers 3 and A2, the capacitors Cg and CD, the resistors Rg, R1, R2, R3, R4 and R5 and the transistors T1, T2, T3 and T4. These elements are connected together in the same way as in FIG. 3.

The new elements are the capacitor $C_L$ and the resistors Ri and RL.

The resistor Ri connects the output of the amplifier A2 to the input e(−) of the differential amplifier 3.

As is known to those skilled in the art, the capacitor $C_L$ and the resistor RL form a circuit usually placed on the input side of the amplifier A2 so as to eliminate, for example, an unnecessary and/or abnormally high DC component associated with the useful signal. For this purpose, the video signal VE is applied to a first plate of the capacitor $C_L$, the second plate of which is connected to the input of the amplifier A2, and the resistor RL has a first terminal connected to the second plate of the capacitor $C_L$ and a second terminal connected to the earth of the circuit.

The apparent input current of the circuit shown in FIG. 4, also noted here by ie, flows through the capacitor $C_L$. In the same way as in the application described in FIG. 3, the current ie flows through the resistor Rg and the calculation of the current ie leads to:

$$ie=Ia/((Rg/R5)+2).$$

Thus, for values of Ia, Rg and R5 such as those mentioned above, the current ie is a very small current.

According to the invention, the value of the resistor RL is very much greater than the value that this same resistor has according to the prior art. By way of example, the value of RL may be equal to 100 kΩ. The values of the resistors Rg, Ri and R5 may then be respectively equal to 1 MΩ, 100 kΩ and 10 kΩ.

The stabilization of the output voltage VS2, due to the action on the offset voltage of the amplifier A2, takes place by means of the resistor Ri.

According to the invention, the offset voltage of the circuit shown in FIG. 4 is equal to:

$$V_{off}=R5 \times Ia/[Rg/Ri]$$

Advantageously, the value of $V_{off}$ is thus very small.

The ratio Rap of the offset voltage according to the invention to the offset voltage according to the circuits known in the prior art is equal to:

$$Rap=Ri \times R5/Rg \times RL$$

For the numerical values mentioned above, it follows that Rap=1%.

Because of the increase in the resistance of the resistor RL, for values of $C_L$ identical to those in the prior art, the low cut-off frequency of the connection established by the elements RL and $C_L$ is advantageously lower according to the invention than according to the prior art.

In order to ensure that the looped system described in FIG. 4 is stabilized, it is important that the following inequality be satisfied:

$$RgCg \geq RLC_L \times \frac{Rg}{Ri} \times \frac{RL}{R5}$$

that is, $$Cg \geq \frac{RL^2}{Ri \times R5} \times C_L$$

According to the preferred embodiment of the invention described in FIG. 4, the voltage VS2 is stabilized to zero volts. The invention also relates to embodiments in which the voltage VS2 is stabilized to a voltage other than zero. The input e(+) of the differential amplifier 3 is then no longer connected to the earth of the circuit but to a voltage source having as value the value to which the voltage VS2 must be stabilized.

Figure 5:
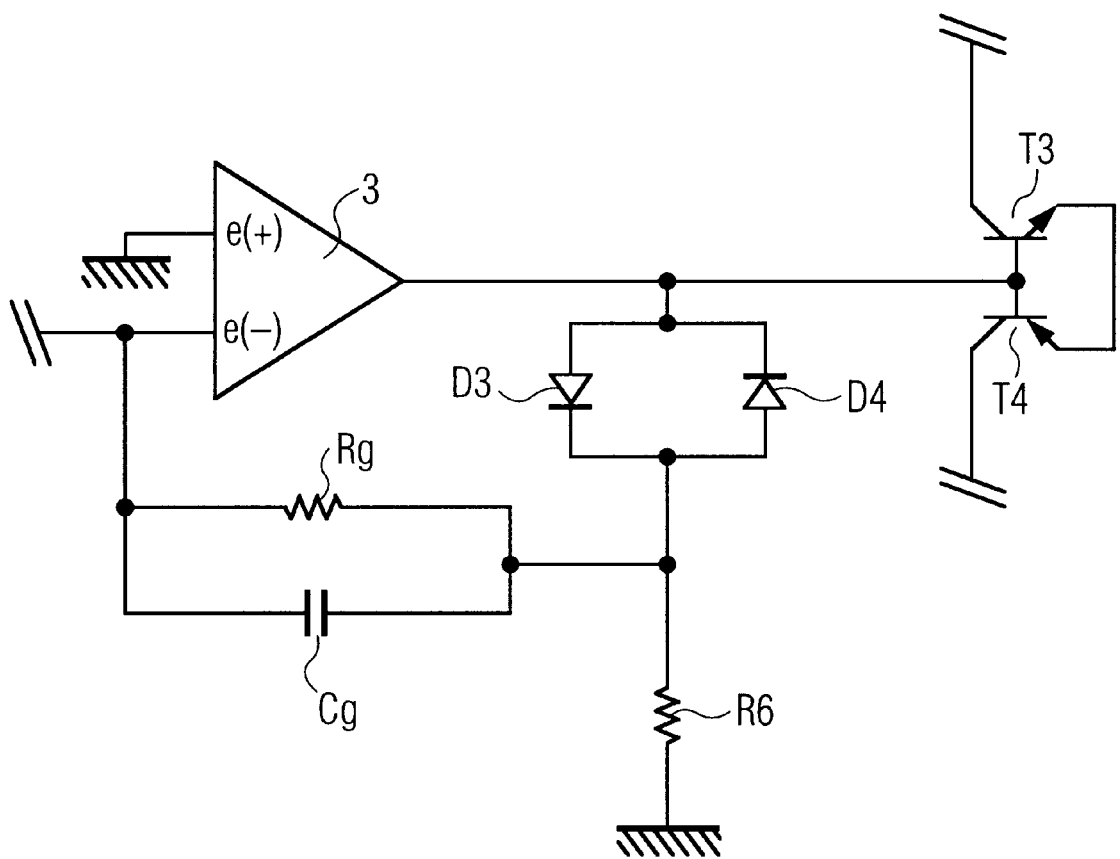
FIG. 5 represents an improvement of a part common to the circuits shown in FIGS. 3 and 4.

FIG. 5 represents an improvement of a part common to the circuits shown in FIGS. 3 and 4.

According to this improvement, the first terminal of the resistor Rg and the first terminal of the capacitor Cg are not connected to the emitters of the transistors T3 and T4.

The first terminal of the resistor Rg and consequently the first terminal of the capacitor Cg are connected, on the one hand, to the first terminal of a resistor R6, the second terminal of which is connected to the earth of the circuit, and, on the other hand, to the cathode and to the anode of the two diodes D3 and D4, the respective anode and cathode of which are connected together and to the output of the differential amplifier 3 which is itself connected to the bases of the transistors T3 and T4.

The resistor R6 has a value more or less equal to that of the resistor R5 (not shown in FIG. 5). The diodes D3 and D4 make it possible to compensate for the conduction threshold of the two transistors T3 and T4 (not shown in FIG. 5).

All the elements R1, R2, R3, R4, R5, D1, D2, T1, T2, T3, T4 and A2 may be produced so as to be combined on a single monolithically integrated component.

According to the embodiments of the invention which are shown in FIGS. 3 and 4, the single monolithically integrated component must have 3 contacts, namely the input of the amplifier A2, the common bases of the transistors T3 and T4, and the common emitters of the transistors T3 and T4.

Advantageously, according to the improvement shown in FIG. 5, the single monolithically integrated component must now have only 2 contacts, namely the input of the amplifier A2 and the common bases of the transistors T3 and T4.

We claim:

1. Amplification circuit, comprising:
   an amplifier (A2) having an input and an output;
   a capacitor (C, $C_L$) having a first plate and a second plate, the second plate of the capacitor being connected to the input of the amplifier and the first plate being connected to an input voltage (VE), an average current ie flowing through the capacitor and the amplifier having as input current a current Ia; and
   means for making the average current ie flowing through the capacitor more or less equal to zero, whatever the value of the current Ia, the making means consisting of a current generator (1) generating a current Ig, and a device (2) for measuring the average current ie, so that ie=Ia−Ig, the current generator having first and second current generators, the first current generator including a pnp-type transistor T1, a resistor R1 having a first terminal and a second terminal, a resistor R2 having a first terminal and a second terminal, and a diode D1, the emitter of the transistor T1 being connected to the first terminal of the resistor R1, the second terminal of the resistor R1 being connected to a positive supply voltage +VA for the amplifier (A2), the base of the transistor T1 being connected to the cathode of the diode D1, the anode of the diode D1 being connected to the first terminal of the resistor R2, the second terminal of of the resistor R2 being connected to the positive supply voltage +VA, the collector of the transistor T1 being connected to the input of the amplifier (A2), and the second current generator including an npn-type transistor T2, a resistor R3 having a first terminal and a second terminal, a resistor R4 having a first terminal and a second terminal, and a diode D2, the emitter of the transistor T2 being connected to the first terminal of the resistor R3, the second terminal of the resistor R3 being connected to a negative voltage −VA for the amplifier (A2), the base of the transistor T2 being connected to the anode of the diode D2, the cathode of the diode D2 being connected to the first terminal of the resistor R4, the second terminal of the resistor R4 being connected to the negative voltage −VA.

2. Amplification circuit according to claim 1, characterized in that the current-measuring device (2) includes a differential amplifier (3) with a positive input e(+) and a negative input e(−), a resistor Rg having a first terminal and a second terminal, a capacitor Cg having a first terminal and a second terminal, an npn-type transistor T3, a pnp-type transistor T4 and a resistor R5 having a first terminal and a second terminal, the positive input e(+) being connected to the earth of the circuit, the negative input e(−) being connected to the first terminal of the capacitor Cg and to the first terminal of the resistor Rg, the second terminal of the capacitor Cg and the second terminal of the resistor Rg being both connected to the first terminal of the resistor R5, the second terminal of which is connected to the earth of the circuit, the output of the differential amplifier being connected to the bases of the transistors T3 and T4, the emitters of which are connected to the first terminal of the resistor R5, the collector of the transistor T3 being connected to the base of the transistor T1 and the collector of the transistor T4 being connected to the base of the transistor T2.

3. Amplification circuit according to claim 1, characterized in that the current-measuring device (2) includes a differential amplifier (3) with a positive input e(+) and a negative input e(−), a resistor Rg having a first terminal and a second terminal, a capacitor Cg having a first terminal and a second terminal, a combination of two diodes (D3, D4) mounted back to back and constituting a dipole having a first terminal and a second terminal, an npn-type transistor T3, a pnp-type transistor T4 and a resistor R5 having a first terminal and a second terminal, the positive input e(+) being connected to the earth of the circuit, the negative input e(−) being connected to the first terminal of the capacitor Cg and to the first terminal of the resistor Rg, the second terminal of the capacitor Cg and the second terminal of the resistor Rg being both connected to the first terminal of the said dipole, the second terminal of which is connected to the bases of the transistors T3 and T4, the output of the differential amplifier being connected to the bases of the transistors T3 and T4, the emitters of which are connected to the first terminal of the resistor R5, the collector of the transistor T3 being connected to the base of the transistor T1 and the collector of the transistor T4 being connected to the base of the transistor T2.

4. Amplification circuit according to claim 1, characterized in that it includes a switch (K) having a first terminal and a second terminal, the first terminal of the switch (K) being connected to the input of the amplifier (A2) and the second terminal of the switch (K) being connected to the negative input e(−) of the differential amplifier (3).

5. Amplification circuit according to claim 1, characterized in that it includes a resistor Ri placed between the output of the amplifier (A2) and the negative input e(−) of the differential amplifier (3).

6. Amplification circuit according to claim 1, characterized in that it includes a capacitor (CD) placed between the negative input e(−) of the differential amplifier (3) and the earth of the circuit.

7. Circuit for restoring the DC component of a video signal, characterized in that it includes an amplification circuit according to claim 4.

8. Voltage stabilization circuit, characterized in that it includes an amplification circuit according to claim 5.

9. Amplification circuit according to claim 2, characterized in that it includes a switch (K) having a first terminal and a second terminal, the first terminal of the switch (K) being connected to the input of the amplifier (A2) and the second terminal of the switch (K) being connected to the negative input e(−) of the differential amplifier (3).

10. Amplification circuit according to claim 3, characterized in that it includes a switch (K) having a first terminal and a second terminal, the first terminal of the switch (K) being connected to the input of the amplifier (A2) and the second terminal of the switch (K) being connected to the negative input e(−) of the differential amplifier (3).

11. Amplification circuit according to claim 2, characterized in that it includes a resistor Ri placed between the output of the amplifier (A2) and the negative input e(−) of the differential amplifier (3).

12. Amplification circuit according to claim 3, characterized in that it includes a resistor Ri placed between the output of the amplifier (A2) and the negative input e(−) of the differential amplifier (3).

13. Amplification circuit according to claim 2, characterized in that it includes a capacitor (CD) placed between the negative input e(−) of the differential amplifier (3) and the earth of the circuit.

14. Amplification circuit according to claim 3, characterized in that it includes a capacitor (CD) placed between the negative input e(−) of the differential amplifier (3) and the earth of the circuit.

15. Amplification circuit according to claim 4, characterized in that it includes a capacitor (CD) placed between the negative input e(−) of the differential amplifier (3) and the earth of the circuit.

16. Amplification circuit according to claim 5, characterized in that it includes a capacitor (CD) placed between the negative input e(−) of the differential amplifier (3) and the earth of the circuit.

17. Circuit for restoring the DC component of a video signal, characterized in that it includes an amplification circuit according to claim 6.

18. Voltage stabilization circuit, characterized in that it includes an amplification circuit according to claim 6.

19. Amplification circuit, comprising:
  an amplifier having an input and an output;
  a capacitor, having a first plate and a second plate, the second plate of the capacitor being connected to the input of the amplifier and the first plate of the capacitor being connected to an input voltage, the capacitor having an average current flowing therethrough and the amplifier having an input current;

means for making the average current substantially equal to zero, the making means including a current generator for generating a first current, and a measuring device for measuring the average current so that the average current equals the input current minus the first current; and a switch which enables during a first period of time, the measuring of the average current, and during a second period of time, the generating of the first current as a function of a previously measured average current.

20. Amplification circuit according to claim 19, wherein the current generator comprises:

a first current generator including a first transistor having a base, an emitter and a collector, the collector of the first transistor being connected to the input of the amplifier, a first resistor having a first terminal and a second terminal, the emitter of the first transistor being connected to the first terminal of the first resistor, the second terminal of the first resistor being connected to a positive supply voltage for the amplifier, a second resistor having a first terminal and a second terminal, the first terminal of the second resistor being connected to the positive supply voltage, and a first diode having an anode and a cathode, the base of the first transistor being connected to the cathode of the first diode, the anode of the first diode being connected to the second terminal of the second resistor; and a second current generator including a second transistor having a base, an emitter and a collector, a third resistor having a first terminal and a second terminal, the first terminal of the second resistor being connected to the emitter of the third transistor, the second terminal of the third resistor being connected to a negative supply voltage for the amplifier, a fourth resistor having a first terminal and a second terminal, the first terminal of the fourth resistor being connected to the negative supply voltage, and a second diode having an anode and a cathode, the base of the second transistor being connected to the anode of the second diode, the cathode of the second diode being connected to the second terminal of the fourth resistor.

21. Amplification circuit according claim 20, wherein the measuring device includes:

a differential amplifier with a positive input and a negative input, the positive input being connected to the earth amplification of the circuit;

a fifth resistor having a first terminal and a second terminal;

a second capacitor having a first terminal and a second terminal, the first terminal of the second capacitor being connected to the negative input and to the first terminal of the fifth resistor;

a third transistor and a fourth transistor, each of the third and fourth transistors having a base, an emitter and a collector, the output of the differential amplifier being connected to the bases of the third and fourth transistors, the emitters of the third and fourth transistors being connected to the first terminal of a sixth resistor, the collector of the third transistor being connected to the base of the first transistor and the collector of the fourth transistor being connected to the base of the second transistor; and a sixth resistor having a first terminal and a second terminal, the second terminal of the second capacitor and the second terminal of the fifth resistor being both connected to the first terminal of the sixth resistor, the second terminal of the sixth resistor being connected to the earth of the amplification circuit.

22. Amplification circuit according to claim 20, wherein the measuring device includes:

a differential amplifier having a positive input and a negative input, the positive input being connected to the earth of the amplification circuit;

a fifth resistor having a first terminal and a second terminal;

a second capacitor having a first terminal and a second terminal, the negative input being connected to the first terminal of the second capacitor and to the first terminal of the fifth resistor;

a combination of two diodes mounted back to back and constituting a dipole having a first terminal and a second terminal, the second terminal of the second capacitor and the second terminal of the fifth resistor being connected to the first terminal of the dipole;

a third transistor and a fourth transistor, each of the third and fourth transistors having a base, an emitter and a collector, the second terminal of the dipole being connected to the bases of the third and fourth transistors, the output of the differential amplifier being connected to the bases of the third and fourth transistors, the collector of the third transistor being connected to the base of the first transistor and the collector of the fourth transistor being connected to the base of the second transistor; and a sixth resistor having a first terminal and a second terminal, the emitters of the third and fourth transistors being connected to the first terminal of the sixth resistor.

23. Amplification circuit according to claim 22, wherein the switch has a first terminal and a second terminal, the first terminal of the switch being connected to the input of the amplifier and the second terminal of the switch being connected to the negative input of the differential amplifier.

24. Amplification circuit according to claim 22, further comprising a third capacitor placed between the negative input of the differential amplifier and the earth of the circuit.

25. Circuit for restoring the DC component of a video signal, wherein the circuit includes an amplification circuit according to claim 23.

26. Amplification circuit, comprising:

an amplifier having an input and an output;

a capacitor having a first plate and a second plate, the second plate of the capacitor being connected to the input of the amplifier and the first plate being connected to an input voltage, the capacitor having an average current flowing therethrough, the amplifier having an input current; and current generator means for generating a first current for making the average current flowing through the capacitor substantially equal to zero, the current generator means including a first current generator providing a positive current, a second current generator providing a negative current, and a device for measuring the average current and for controlling the current generator means so that the average current equals the input current minus the first current.

27. Amplification circuit according to claim 26, wherein the first current generator includes:

a first transistor having a base, an emitter and a collector, the collector of the first transistor being connected to the input of the amplifier;

a first resistor having a first terminal and a second terminal, the emitter of the first transistor being connected to the first terminal of the first resistor, the second terminal of the first resistor being connected to a positive supply voltage for the amplifier;

a second resistor having a first terminal and a second terminal, the first terminal of the second resistor being connected to the positive supply voltage; and a first diode having an anode and a cathode, the base of the first transistor being connected to the cathode of the first diode, the anode of the first diode being connected to the second terminal of the second resistor; and the second current generator includes:

a second transistor having a base, an emitter and a collector;

a third resistor having a first terminal and a second terminal, the first terminal of the third resistor being connected to the emitter of the second transistor, the second terminal of the third resistor being connected to a negative supply voltage for the amplifier;

a fourth resistor having a first terminal and a second terminal, the first terminal of the fourth resistor being connected to the negative supply voltage; and a second diode having an anode and a cathode, the base of the second transistor being connected to the anode of the second diode whose cathode is connected to the second terminal of the fourth resistor.

28. Amplification circuit according to claim 27, wherein the device includes:

a differential amplifier with a positive input and a negative input, the positive input being connected to the earth of the amplification circuit;

a fifth resistor having a first terminal and a second terminal;

a second capacitor having a first terminal and a second terminal, the first terminal of the second capacitor being connected to the negative input and to the first terminal of the fifth resistor;

a third transistor and a fourth transistor, each of the third and fourth transistors having a base, an emitter and a collector, the output of the differential amplifier being connected to the bases of the third and fourth transistors, the emitters of the third and fourth transistors being connected to the first terminal of a sixth resistor, the collector of the third transistor being connected to the base of the first transistor and the collector of the fourth transistor being connected to the base of the second transistor; and a sixth resistor having a first terminal and a second terminal, the second terminal of the second capacitor and the second terminal of the fifth resistor being both connected to the first terminal of the sixth resistor, the second terminal of the sixth resistor being connected to the earth of the circuit.

29. Amplification circuit according to claim 27, wherein the device includes:

a differential amplifier having a positive input and a negative input, the positive input being connected to the earth of the amplification circuit;

a fifth resistor having a first terminal and a second terminal;

a second capacitor having a first terminal and a second terminal, the negative input being connected to the first terminal of the second capacitor and to the first terminal of the fifth resistor;

a combination of two diodes mounted back to back and constituting a dipole having a first terminal and a second terminal, the second terminal of the second capacitor and the second terminal of the fifth resistor being both connected to the first terminal of the dipole;

a third transistor and a fourth transistor, each of the third and fourth transistors having a base, an emitter and a collector, the second terminal of the dipole being connected to the bases of the third and fourth transistors, the output of the differential amplifier being connected to the bases of the third and fourth transistors, the collector of the third transistor being connected to the base of the first transistor and the collector of the fourth transistor being connected to the base of the second transistor; and a sixth resistor having a first terminal and a second terminal, the emitters of the third and fourth transistors being connected to the first terminal of the sixth resistor.

30. Amplification circuit according to claim 28, wherein the switch has a first terminal and a second terminal, the first terminal of the switch being connected to the input of the amplifier and the second terminal of the switch being connected to the negative input of the differential amplifier.

31. Amplification circuit according to claim 28, further including a seventh resistor placed between the output of the amplifier and the negative input of the differential amplifier.

32. Amplification circuit according to claim 28, wherein the amplification circuit includes a third capacitor placed between the negative input of the differential amplifier and the earth of the amplification circuit.

33. Circuit for restoring the DC component of a video signal, wherein the circuit includes an amplification circuit according to claim 30.

34. Voltage stabilization circuit including an amplification circuit according to claim 31.

* * * * *